(12) United States Patent
Shiratake

(10) Patent No.: US 6,917,535 B2
(45) Date of Patent: Jul. 12, 2005

(54) COLUMN SELECT CIRCUIT OF FERROELECTRIC MEMORY

(75) Inventor: Shinichiro Shiratake, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 100 days.

(21) Appl. No.: 10/671,468

(22) Filed: Sep. 29, 2003

(65) Prior Publication Data

US 2004/0208045 A1 Oct. 21, 2004

(30) Foreign Application Priority Data

Apr. 18, 2003 (JP) ........................................ 2003-114723

(51) Int. Cl.[7] .............................................. G11C 11/22
(52) U.S. Cl. ........................ 365/145; 365/205; 365/190
(58) Field of Search ................................ 365/145, 205, 365/190, 202, 210

(56) References Cited

U.S. PATENT DOCUMENTS 6,097,624 A * 8/2000 Chung et al. ................ 365/145

FOREIGN PATENT DOCUMENTS

JP          8-273372          10/1996

* cited by examiner

*Primary Examiner*—David Lam
(74) *Attorney, Agent, or Firm*—Oblon, Spivak, McClelland, Maier & Neustadt, P.C.

(57) ABSTRACT

A column select gate in a ferroelectric memory is constituted by only P-channel MOS transistors. While a column select signal is set to low level, and a data line is set to 0 V, data is read out from a memory cell to a bit line. A potential amplified and held by a sense amplifier is transferred to the data line through the current path of the column select gate formed from the P-channel MOS transistors.

25 Claims, 7 Drawing Sheets

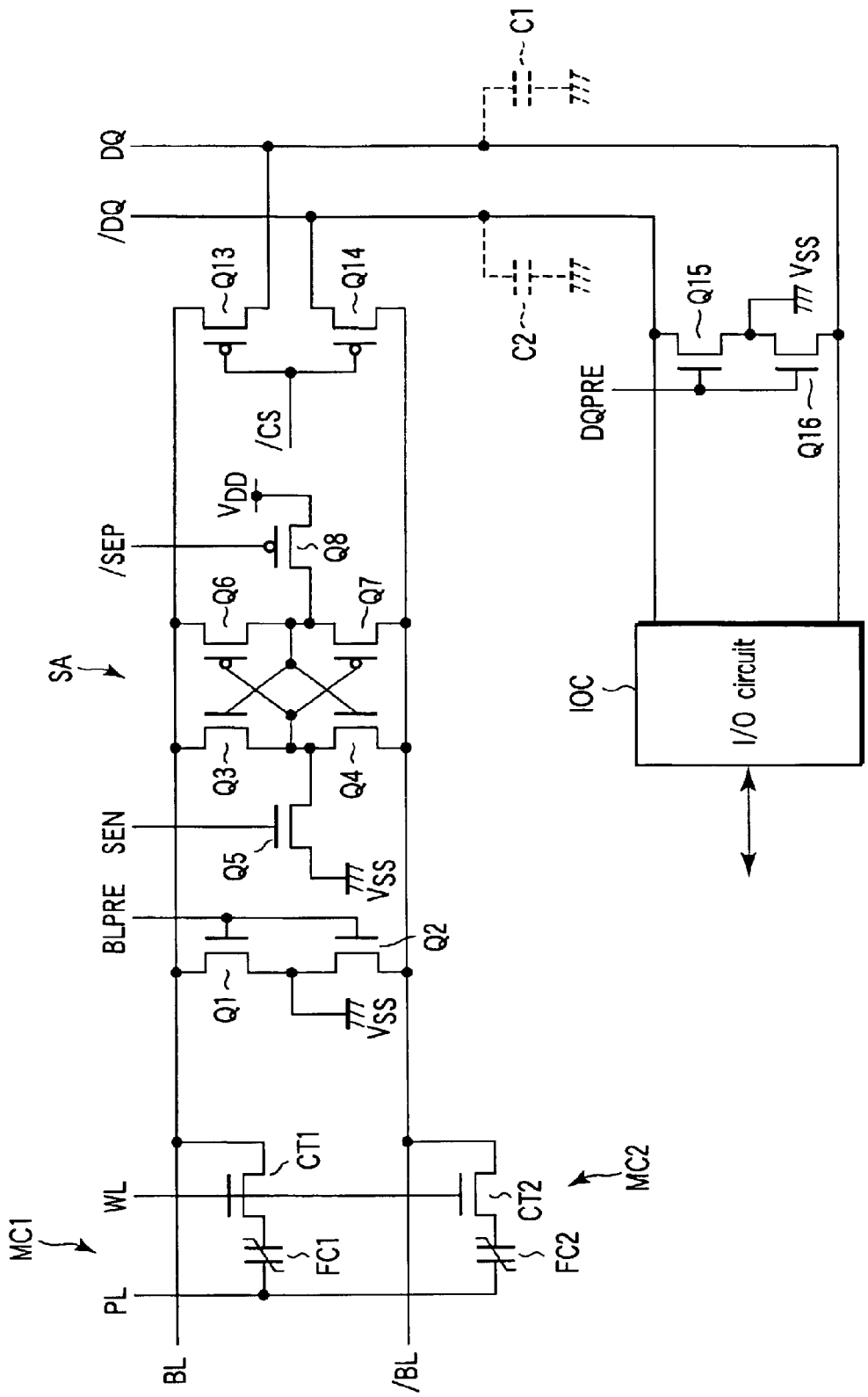
F I G. 7

COLUMN SELECT CIRCUIT OF FERROELECTRIC MEMORY

CROSS-REFERENCE TO RELATED APPLICATIONS

This application is based upon and claims the benefit of priority from the prior Japanese Patent Application No. 2003-114723, filed Apr. 18, 2003, the entire contents of which are incorporated herein by reference.

BACKGROUND OF THE INVENTION

1. Field of the Invention

The present invention relates to a ferroelectric memory which stores data in correspondence with the polarization state of a ferroelectric substance and, more particularly, to a column select circuit which selectively transfers data from a sense amplifier to a data line.

2. Description of the Related Art

A ferroelectric memory is read-accessed by transferring data from a memory cell to a bit line and amplifying the data, as in a DRAM. FIG. 1 is a circuit diagram showing main part associated with such read operation of a ferroelectric memory. A memory cell MC having a cell transistor CT and ferroelectric capacitor FC and a dummy cell DMC formed from a transistor DCT are connected to a pair of bit lines BL and /BL. The cell transistor CT and transistor DCT are N-channel MOS transistors (NMOS transistors). One end of the current path of the cell transistor CT is connected to the bit line BL. The other end is connected to one electrode of the ferroelectric capacitor FC. The gate is connected to a word line WL. The other electrode of the ferroelectric capacitor FC is connected to a plate line PL. One end of the current path of the transistor DCT is connected to the bit line /BL. The other end is connected to a reference voltage source VREF. The gate is connected to a dummy word line DWL.

The current paths of bit line precharge NMOS transistors Q1 and Q2 are connected between the bit lines BL and /BL and a ground point $V_{SS}$. A bit line precharge signal BLPRE is supplied to the gates of the NMOS transistors Q1 and Q2.

A sense amplifier SA which amplifies and holds the data of the memory cell MC is connected between the bit lines BL and /BL. The sense amplifier SA comprises NMOS transistors Q3 to Q5 and P-channel MOS transistors (PMOS transistors) Q6 to Q8. The operation of the sense amplifier SA is controlled by sense amplifier enable signals SEN and /SEP. The current paths of the NMOS transistors Q3 and Q4 are connected in series between the bit lines BL and /BL. The current path of the NMOS transistor Q5 is connected between the ground point $V_{SS}$ and the connection point of the current paths of the NMOS transistors Q3 and Q4. The sense amplifier enable signal SEN is supplied to the gate of the NMOS transistor Q5 to ON/OFF-control the NMOS transistor Q5. The current paths of the PMOS transistors Q6 and Q7 are connected in series between the bit lines BL and /BL. The current path of the PMOS transistor Q8 is connected between a power supply $V_{DD}$ and the connection point of the current paths of the PMOS transistors Q6 and Q7. The sense amplifier enable signal /SEP is supplied to the gate of the PMOS transistor Q8 to ON/OFF-control the PMOS transistor Q8. The gates of the NMOS transistors Q3 and Q4 are connected to the connection point between the current paths of the PMOS transistors Q6 and Q7. The gates of the PMOS transistors Q6 and Q7 are connected to the connection point between the current paths of the NMOS transistors Q3 and Q4.

The current path of an NMOS transistor Q9 is connected between the bit line BL and a data line DQ. The current path of an NMOS transistor Q10 is connected between the bit line /BL and a data line /DQ. The NMOS transistors Q9 and Q10 function as a column select gate. A column select signal CS is supplied to the gates of the NMOS transistors Q9 and Q10.

The current paths of PMOS transistors Q11 and Q12 are connected in series between the data lines DQ and /DQ. The power supply $V_{DD}$ is connected to the connection point between the current paths of the PMOS transistors Q11 and Q12. A data line precharge signal /DQPRE is supplied to the gates of the PMOS transistors Q11 and Q12.

Output of data read out from the memory cell MC or input of data to be written in the memory cell MC is done by an I/O circuit IOC connected to the data lines DQ and /DQ.

Capacitors C1 and C2 indicated by broken lines are the parasitic capacitances of the data lines DQ and /DQ.

FIG. 2 is a timing chart showing the operation waveforms of the circuit portion shown in FIG. 1. First, the bit line precharge signal BLPRE is set to high level ("H" level) to turn on the NMOS transistors Q1 and Q2, thereby setting the bit lines BL and /BL in a low level ("L" level) state (timing tA). The operation of setting the bit lines BL and /BL to "L" level as initial settling will be referred to as precharge for the descriptive convenience.

Next, the word line WL and plate line PL are raised from "L" level to "H" level (timing tB) to apply a voltage to the ferroelectric capacitor (memory cell capacitor) FC, thereby transferring data corresponding to the polarization state of the ferroelectric film in the memory cell capacitor FC to the bit line BL. When "1" data is stored in the memory cell capacitor FC, polarization reversal occurs at PA=VAA and BL=0 V in read operation, and charges are transferred to the bit line BL. To the contrary, when "0" data is stored, no polarization reversal takes place, and therefore, no charges are transferred to the bit line BL.

Simultaneously with the read operation from the memory cell MC, the dummy word line DWL changes to "H" level, so the reference potential from the reference voltage source VREF is applied to the bit line (reference bit line) /BL that is complementary to the bit line BL. Accordingly, the potential of the bit line /BL is set to an intermediate potential between the potential obtained when "1" data is read out and that obtained when "0" data is read out.

When the sense amplifier enable signal SEN changes to "H" level and /SEP to "L" level to activate the sense amplifier SA (timing tC), the potential difference between the bit line BL and the reference bit line /BL is amplified and held. As a result, when "1" data is read out from the memory cell MC, the potential of the bit line BL changes to VAA, and the potential of the reference bit line /BL changes to 0 V. On the other hand, when "0" data is read out, the potential of the bit line BL changes to 0 V, and the potential of the reference bit line /BL changes to VAA.

When "0" data is read out to the bit line BL, a voltage −VAA is applied to the memory cell capacitor FC, and the "0" data is restored to the memory cell capacitor FC because the potential of the bit line BL is 0 V, and the potential of the plate line PL is VAA (timing tD). On the other hand, when "1" data is read out to the bit line BL, and the potential of the plate line PL changes to 0 V later, a voltage +VAA is applied to the memory cell capacitor FC, and the "1" data is restored because PL=0 V and BL=VAA (timing tF).

The data amplified and held by the sense amplifier SA is transferred to the data lines DQ and /DQ when the column select signal CS is activated (timing tE) to turn on the NMOS transistors Q9 and Q10. Accordingly, data corresponding to the potentials of the data lines DQ and /DQ is output from the I/O circuit IOC.

As described above, when the column select gate is constituted by only the NMOS transistors Q9 and Q10, and the data lines DQ and /DQ are precharged to "H" level, the data latched by the sense amplifier SA is not destroyed normally even when both the data lines DQ and /DQ are connected to the power supply (potential VAA) (this state equals an infinite parasitic capacitance). This is because the threshold voltage of the NMOS transistors Q9 and Q10 has a finite magnitude, and the "0" data latched by the sense amplifier SA by the potential VAA of the data lines DQ and /DQ cannot be completely raised to the VAA level. That is, when the data line DQ or /DQ and the bit line BL or reference bit line /BL are at level near the potential VAA, data destruction is prevented using a characteristic that the data lines and bit lines are not completely rendered conductive.

However, since the data line DQ that is precharged to "H" level is connected to the bit line BL through the column select gate formed from the NMOS transistor Q9, only the "L"-level side potential, i.e., the 0 V potential of the potentials of the bit lines BL and /BL, which are amplified by the sense amplifier SA, i.e., becomes higher by $\Delta V$.

At this time, as shown in FIG. 3, since the potential of the plate line PL is VAA, and the potential of the bit line BL is $V_{SS}(0\ V)+\Delta V$, the voltage applied to the memory cell capacitor FC is $-(VAA-\Delta V)$ that is lower than $-VAA$, i.e., the ideal write voltage for "0" data.

To apply the ideal write voltage $-VAA$ to the memory cell MC, the potential of the plate line PL is changed to 0 V after the column select signal CS is set in an inactive state, and the potential of the bit line BL returns to 0 V again. In this case, however, the performance is poor because the time until the potential of the bit line BL returns from $\Delta V$ to 0 V is added to the cycle time of the ferroelectric memory.

To avoid the above-described problem, a structure in which a column select gate is formed as a CMOS transfer gate, i.e., the current paths of an NMOS transistor and a PMOS transistor are connected in parallel has been proposed (e.g., Jpn. Pat. Appln. KOKAI Publication No. H08-273372).

In this structure, since the current drivability of the column select gate increases, the transfer speed for data latched by the sense amplifier SA to the data lines DQ and /DQ is high. This structure is therefore suitable for a high-speed memory.

However, since the number of elements and the number of control signal lines increase, the layout area and the power consumption of the control circuit become large. In addition, since a PMOS transistor and an NMOS transistor are combined, they are always rendered conductive regardless of the combination of potentials of the bit lines BL and /BL and data lines DQ and /DQ. Since no dead zone is present, operation is unstable. For this reason, unless the parasitic capacitances C1 and C2 of the data lines DQ and /DQ are much smaller than the capacitances of the bit lines BL and /BL, data latched by the bit lines BL and /BL may be destroyed by the initial potential of the data lines DQ and /DQ. Hence, the data lines DQ and /DQ cannot be shared by a number of sense amplifiers SA. This increases the layout area and results in difficulty in applying the structure to a large-capacity memory.

As described above, in the conventional ferroelectric memory, when data read out from a memory cell is restored, the data degrades, and no data read margin can be ensured.

In addition, if this problem should be solved, the number of elements and the number of control signal lines increase. For this reason, the layout area and the power consumption of the control circuit also become large.

BRIEF SUMMARY OF THE INVENTION

According to an aspect of the present invention, there is provided a ferroelectric memory comprising a memory cell which stores data in correspondence with a polarization state of a ferroelectric substance, a first bit line connected to the memory cell, a sense amplifier connected to the first bit line, a first data line to which data is transferred, and a first column select gate which is formed from a P-channel MOS transistor that has a current path connected between the first bit line and the first data line and is controlled by a column select signal, wherein while the first data line is set to 0 V, data is read out from the memory cell to the first bit line, amplified and held by the sense amplifier, and transferred from the first bit line to the first data line through the first column select gate by setting the column select signal to low level.

BRIEF DESCRIPTION OF THE SEVERAL VIEWS OF THE DRAWING

FIG. 7 is a circuit diagram showing main part associated with the read operation of a ferroelectric memory according to the second embodiment of the present invention so as to explain the ferroelectric memory;

DETAILED DESCRIPTION OF THE INVENTION

[First Embodiment]

Figure 4:
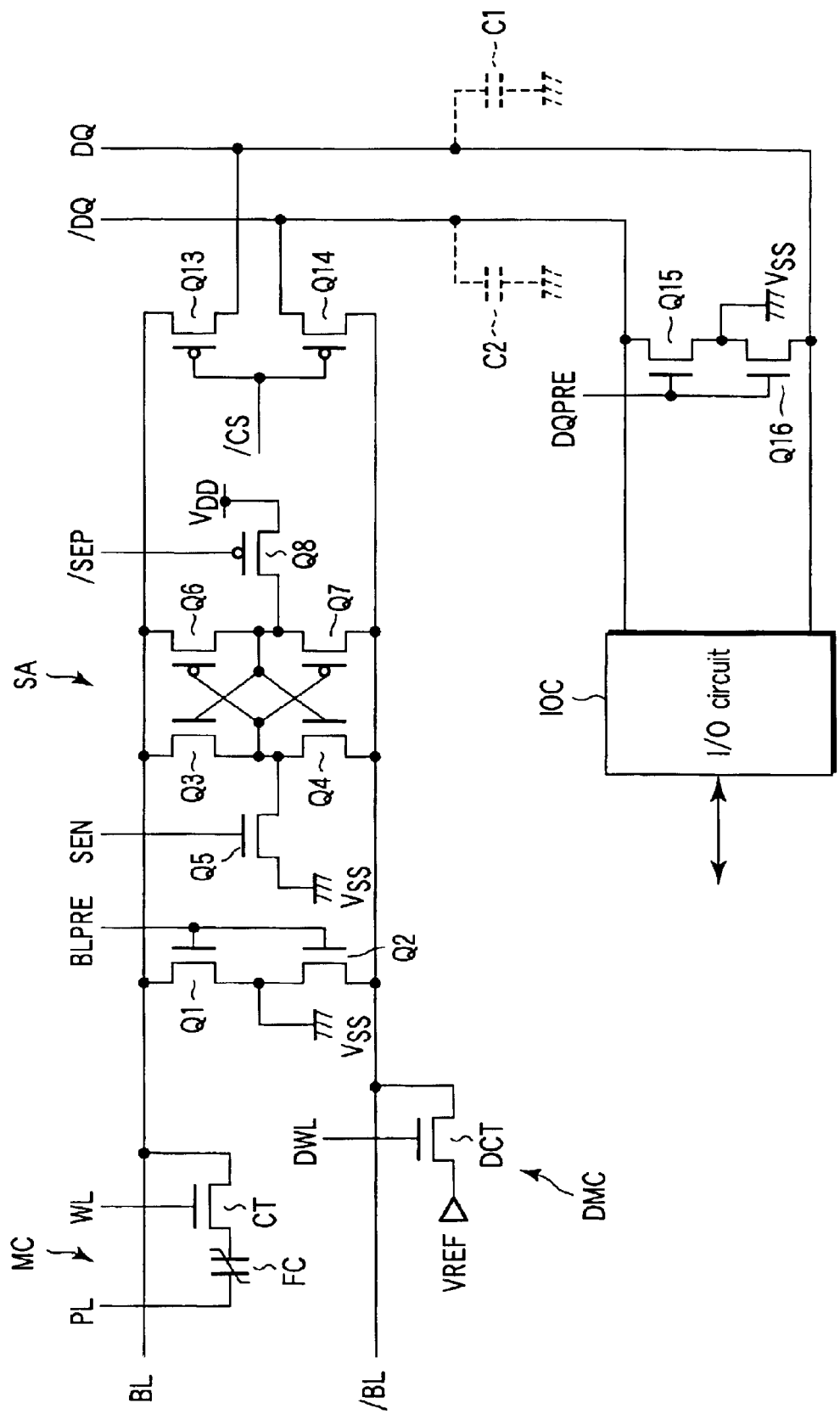
FIG. 4 is a circuit diagram showing main part associated with the read operation of a ferroelectric memory according to the first embodiment of the present invention so as to explain the ferroelectric memory.

FIG. 4 is a circuit diagram showing main part associated with the read operation of a ferroelectric memory according to the first embodiment of the present invention so as to explain the ferroelectric memory.

A memory cell MC having a cell transistor CT and ferroelectric capacitor FC and a dummy cell DMC formed from a N-channel MOS transistor DCT are connected to a pair of bit lines BL and /BL. The cell transistor CT and transistor DCT are NMOS transistors. One end of the current path of the cell transistor CT is connected to the bit line BL. The other end is connected to one electrode of the ferroelectric capacitor FC. The gate is connected to a word line WL. The other electrode of the ferroelectric capacitor FC is connected to a plate line PL. One end of the current path of the transistor DCT is connected to the reference bit line /BL. The other end is connected to a reference voltage source VREF. The gate is connected to a dummy word line DWL.

The current paths of bit line precharge NMOS transistors Q1 and Q2 are connected between the bit lines BL and /BL and a ground point $V_{SS}$. A bit line precharge signal BLPRE is supplied to the gates of the NMOS transistors Q1 and Q2.

A sense amplifier SA which amplifies and holds the data of the memory cell MC is connected between the bit lines BL and /BL. The sense amplifier SA comprises NMOS transistors Q3 to Q5 and PMOS transistors Q6 to Q8. The operation of the sense amplifier SA is controlled by sense amplifier enable signals SEN and /SEP. The current paths of the NMOS transistors Q3 and Q4 are connected in series between the bit lines BL and /BL. The current path of the NMOS transistor Q5 is connected between the ground point $V_{SS}$ and the connection point of the current paths of the NMOS transistors Q3 and Q4. The sense amplifier enable signal SEN is supplied to the gate of the NMOS transistor Q5 to ON/OFF-control the NMOS transistor Q5. The current paths of the PMOS transistors Q6 and Q7 are connected in series between the bit lines BL and /BL. The current path of the PMOS transistor Q8 is connected between a power supply $V_{DD}$ and the connection point of the current paths of the PMOS transistors Q6 and Q7. The sense amplifier enable signal /SEP is supplied to the gate of the PMOS transistor Q8 to ON/OFF-control the PMOS transistor Q8. The gates of the NMOS transistors Q3 and Q4 are connected to the connection point between the current paths of the PMOS transistors Q6 and Q7. The gates of the PMOS transistors Q6 and Q7 are connected to the connection point between the current paths of the NMOS transistors Q3 and Q4.

The current path of a PMOS transistor Q13 is connected between the bit line BL and a data line DQ. The current path of a PMOS transistor Q14 is connected between the reference bit line /BL and a data line /DQ. A column select signal (an activation signal used to selectively transfer data held by the sense amplifier SA to the data lines DQ and /DQ) /CS is supplied to the gates of the PMOS transistors Q13 and Q14.

The current paths of NMOS transistors Q15 and Q16 are connected in series between the data lines DQ and /DQ. The ground point $V_{SS}$ is connected to the connection point between the current paths of the NMOS transistors Q15 and Q16. A data line precharge signal DQPRE is supplied to the gates of the NMOS transistors Q15 and Q16. The data lines DQ and /DQ have parasitic capacitances (equivalently represented by capacitors C1 and C2) indicated by broken lines.

An I/O circuit IOC is connected to the data lines DQ and /DQ. The I/O circuit IOC executes output of data read out from the memory cell MC or input of data to be written in the memory cell MC.

As is apparent from FIG. 4, in this embodiment, the column select gate (CSL gate) that is conventionally constituted by the NMOS transistors Q9 and Q10 is formed from the PMOS transistors Q13 and Q14. In addition, the precharge transistors of the data lines DQ and /DQ, which are conventionally constructed by the PMOS transistors Q11 and Q12, are formed from the NMOS transistors Q15 and Q16. The column select signal /CS (a signal having a phase opposite to that of the signal CS) is supplied to the gates of the PMOS transistors Q13 and Q14 serving as the column select gate to ON/OFF-control the PMOS transistors Q13 and Q14. The data line precharge signal DQPRE (a signal having a phase opposite to that of the signal /DQPRE) is supplied to the gates of the data line pair precharge NMOS transistors Q15 and Q16 to ON/OFF-control the NMOS transistors Q15 and Q16.

Figure 1:
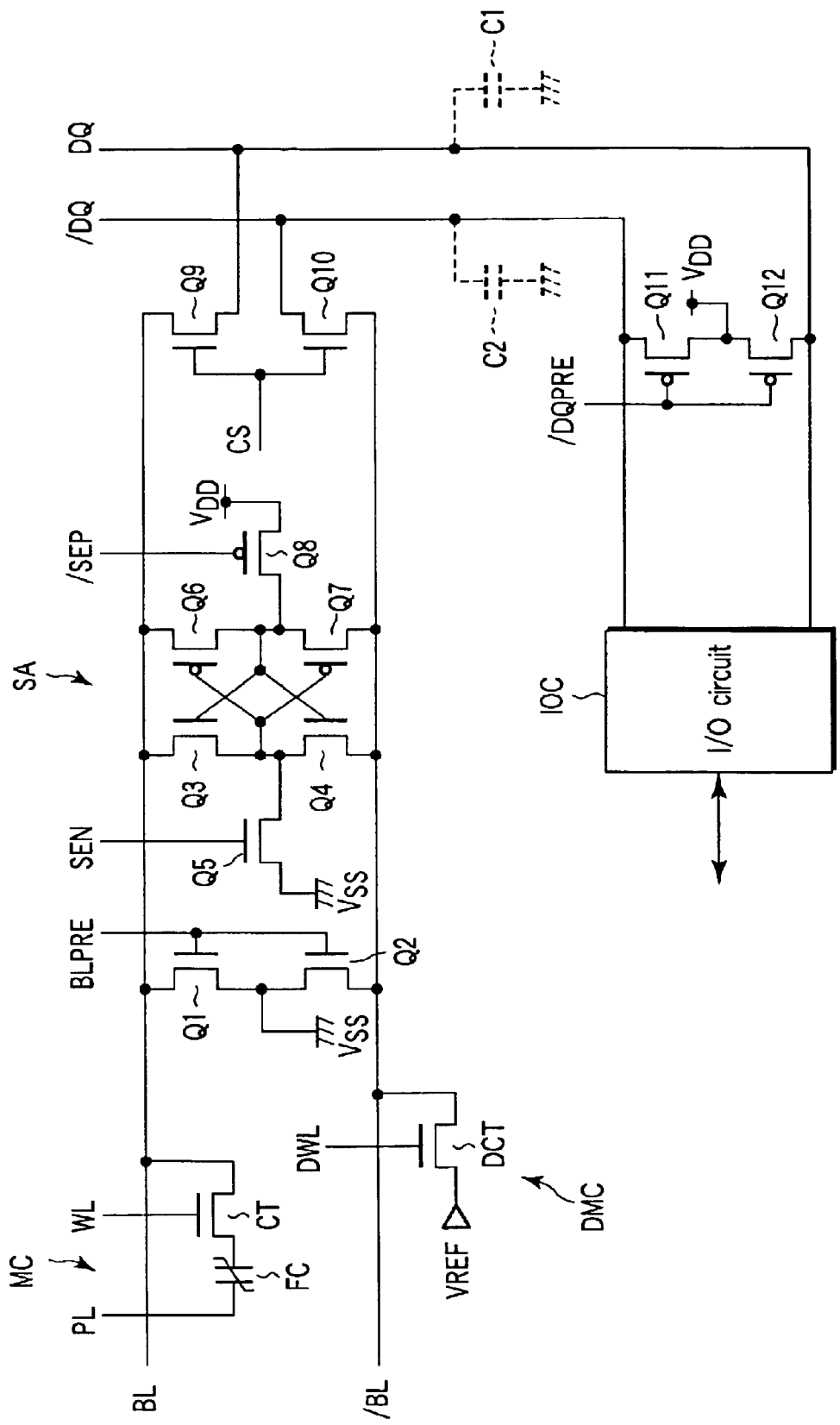
FIG. 1 is a circuit diagram showing main part associated with the read operation of a conventional ferroelectric memory.
Figure 2:
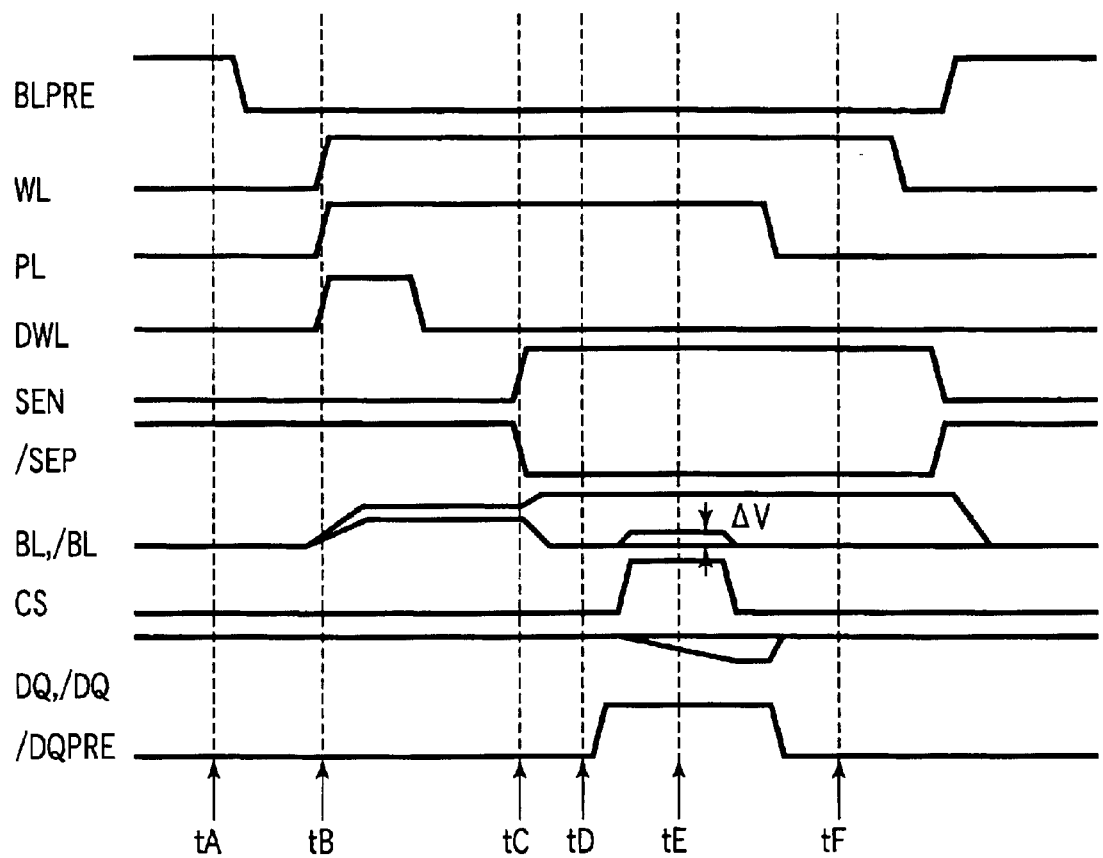
FIG. 2 is a timing chart showing the operation waveforms of the circuit portion shown in FIG. 1.
Figure 3:
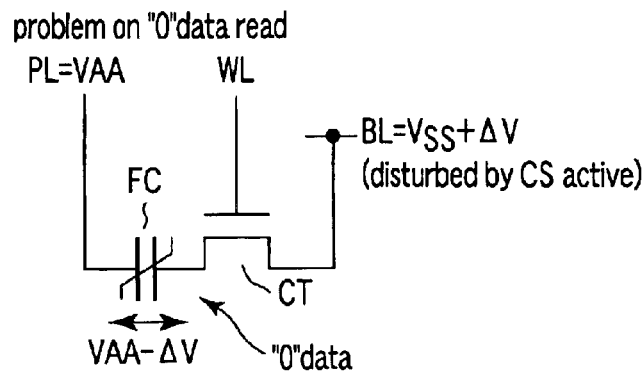
FIG. 3 is a circuit diagram showing the relationship between potentials so as to explain a "0" data write voltage for a memory cell in the conventional ferroelectric memory.
Figure 5:
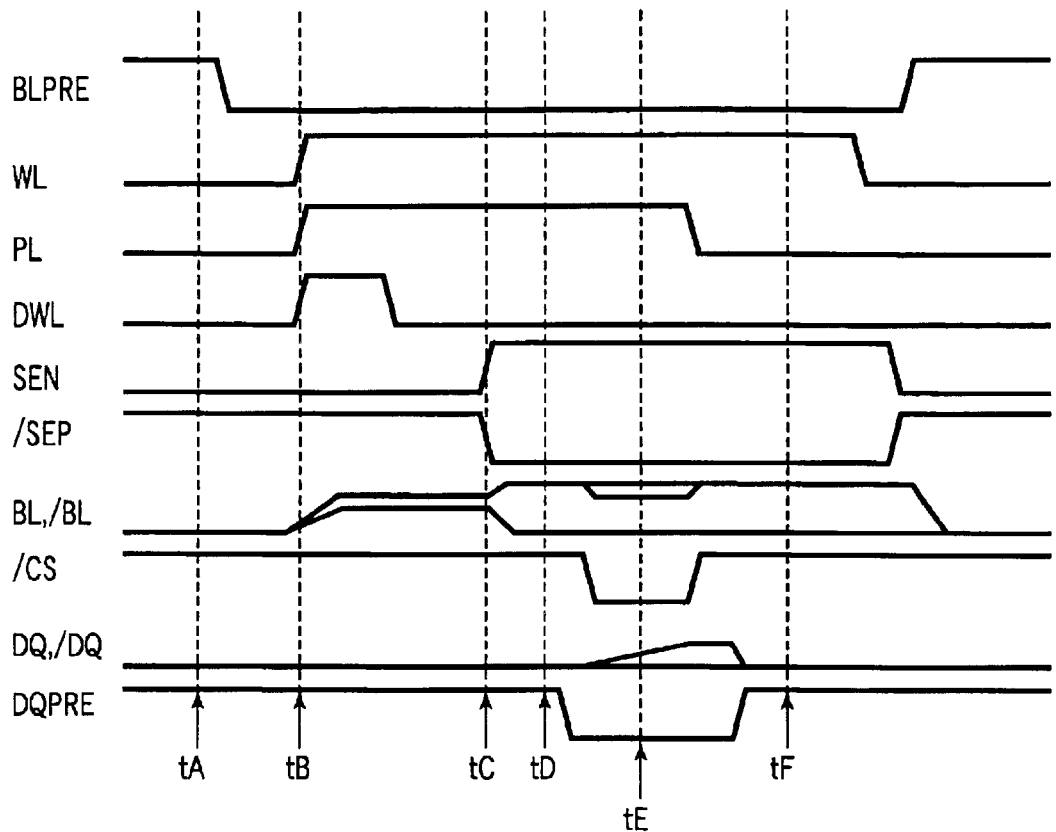
FIG. 5 is a timing chart showing the operation waveforms of the ferroelectric memory shown in FIG. 4.

The operation of the above arrangement will be described next. FIG. 5 is a timing chart showing the operation waveforms of this embodiment. Operation of reading out data stored in the memory cell MC to the bit line BL is the same as that of the circuit shown in FIG. 1. More specifically, first, the bit line precharge signal BLPRE is set to "H" level to turn on the NMOS transistors Q1 and Q2, thereby setting the bit lines BL and /BL in an "L" level state (timing tA). Next, the word line WL, plate line PL, and dummy word line DWL are raised from "L" level to "H" level (timing tB) to apply a voltage to the ferroelectric capacitor (memory cell capacitor) FC. Accordingly, data corresponding to the polarization state of the memory cell capacitor FC is transferred to the bit line BL. When "1" data is stored in the memory cell capacitor FC polarization reversal occurs at PA=VAA and BL=0 V in read operation, and charges are transferred to the bit line BL. To the contrary, when "0" data is stored, no polarization reversal takes place, and therefore, no charges are transferred to the bit line BL.

When the dummy word line DWL changes to "H" level, simultaneously with the read operation from the memory cell MC, the reference potential from the reference voltage source VREF is applied to the reference bit line /BL that is complementary to the bit line BL. Accordingly, the potential of the reference bit line /BL is set to a reference potential, i.e., an intermediate potential between the potential obtained when "1" data is read out to the bit line BL and that obtained when "0" data is read out.

When the sense amplifier enable signal SEN changes to "H" level and /SEP to "L" level to activate the sense amplifier SA (timing tC), the potential difference between the bit line BL and the reference bit line /BL is amplified. As a result, when "1" data is read out from the memory cell MC, the potential of the bit line BL changes to VAA, and the potential of the reference bit line /BL changes to 0 V. On the other hand, when "0" data is read out, the potential of the bit line BL changes to 0 V, and the potential of the reference bit line /BL changes to VAA.

When "0" data is read out to the bit line BL, a voltage −VAA is applied to the memory cell capacitor FC, and the "0" data is restored to the memory cell capacitor FC because the potential of the bit line BL is 0 V, and the potential of the plate line PL is VAA (timing tD). On the other hand, when "1" data is read out to the bit line BL, and the potential of the plate line PL changes to 0 V later, a voltage +VAA is applied to the memory cell capacitor FC, and the "1" data is restored because PL=0 V and BL=VAA (timing tF).

The data amplified and held by the sense amplifier SA is transferred to the data lines DQ and /DQ when the column select signal /CS is activated (timing tE) to turn on the PMOS transistors Q13 and Q14 serving as the column select gate.

The data lines DQ and /DQ are set to 0 V by the data line precharge signal DQPRE of "L" level. The column select signal /CS is normally at "H" level. When it is activated, it changes to "L" level. When the column select signal is activated, the bit lines BL and /BL and the data lines DQ and /DQ are connected through the PMOS transistors Q13 and Q14. The data lines DQ and /DQ are set to 0 V. For this reason, of the potentials of the bit lines BL and /BL, the potential on the "H" level side drops by ΔV to VAA−ΔV. On the other hand, the threshold voltage of the PMOS transistors Q13 and Q14 is higher than 0 V. For this reason, the potential of the bit line on the "L" level side remains 0 V.

Figure 6A:
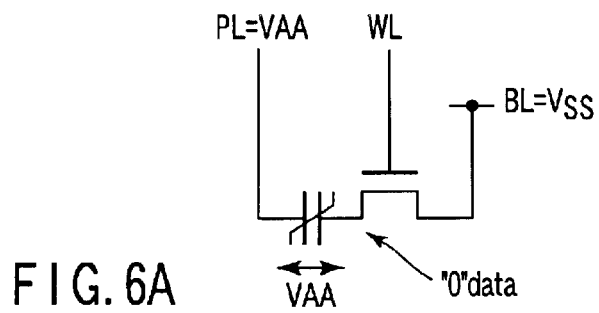
FIG. 6A is a circuit diagram showing the relationship between potentials so as to explain restore operation after read operation in the ferroelectric memory shown in FIG. 4 and, more particularly, a "0" data write voltage for a memory cell.

Hence, in this embodiment, as shown in FIG. 6A, in restoring "0" data to the memory cell capacitor FC after the data read, the potential of the bit line BL is 0 V, and the potential of the plate line PL is VAA, though the PMOS transistors Q13 and Q14 are activated. Hence, the ideal voltage −VAA is applied to the memory cell capacitor FC.

Figure 6B:
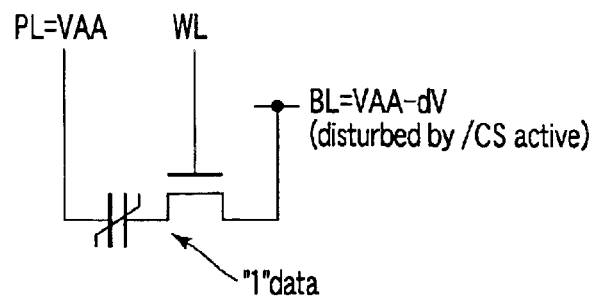
FIG. 6B is a circuit diagram showing the relationship between potentials so as to explain restore operation after read operation in the ferroelectric memory shown in FIG. 4 and, more particularly, a "1" data write voltage for a memory cell.

On the other hand, restoring of "1" data after the data read is done after the potential of the plate line PL changes to 0 V, as in the prior art, as shown in FIG. 6B. At this time, the PMOS transistors Q13 and Q14 are not activated. The voltage applied to the memory cell capacitor by the write of "1" data is the ideal voltage +VAA. No decrease in signal amount due to activation of the PMOS transistors Q13 and Q14 occurs.

As described above, in the structure in which the column select gate is constructed by only PMOS transistors, and the data lines DQ and /DQ are precharged (initially set) to "L" ($V_{SS}$) level, the data latched by the sense amplifier SA is not destroyed when the threshold voltage of the PMOS transistors is finite. More specifically, in the circuit arrangement shown in FIG. 4, when the data lines DQ and /DQ and bit lines BL and /BL are set to potentials near 0 V ($V_{SS}$) due to the threshold voltage of the PMOS transistors Q13 and Q14, data destruction can be prevented by using the characteristic that the transistors are not electrically connected, i.e., by generating a dead zone.

Hence, according to the ferroelectric memory having the above arrangement, any degradation in data in restoring data read out from a memory cell can be prevented, and the data read margin can be ensured without increasing the cycle time and layout area.

[Second Embodiment]

FIG. 7 is a circuit diagram showing main part associated with the read operation of a ferroelectric memory according to the second embodiment of the present invention so as to explain the ferroelectric memory. The above-described first embodiment is applied to a ferroelectric memory having a 1T1C structure which stores 1-bit data using one cell transistor and one ferroelectric capacitor. The second embodiment is applied to a ferroelectric memory having a so-called 2T2C structure which stores 1-bit data using two cell transistors and two ferroelectric capacitors.

A memory cell MC1 having a cell transistor CT1 and ferroelectric capacitor FC1 is connected to a bit line BL. A memory cell MC2 having a cell transistor CT2 and ferroelectric capacitor FC2 is connected to a bit line /BL. One end of each of the current paths of the cell transistors CT1 and CT2 is connected to a corresponding one of the bit lines BL and /BL. The other end of each of the current paths is connected to one electrode of a corresponding one of the ferroelectric capacitors FC1 and FC2. The gates of the cell transistors CT1 and CT2 are commonly connected to a word line WL. The other electrode of each of the ferroelectric capacitors FC1 and FC2 is commonly connected to a plate line PL. Complementary data are stored in the pair of memory cells MC1 and MC2.

The remaining components are the same as those shown in FIG. 4. The same reference numerals as in FIG. 4 denote the same parts in FIG. 7, and a detailed description thereof will be omitted.

Figure 8:
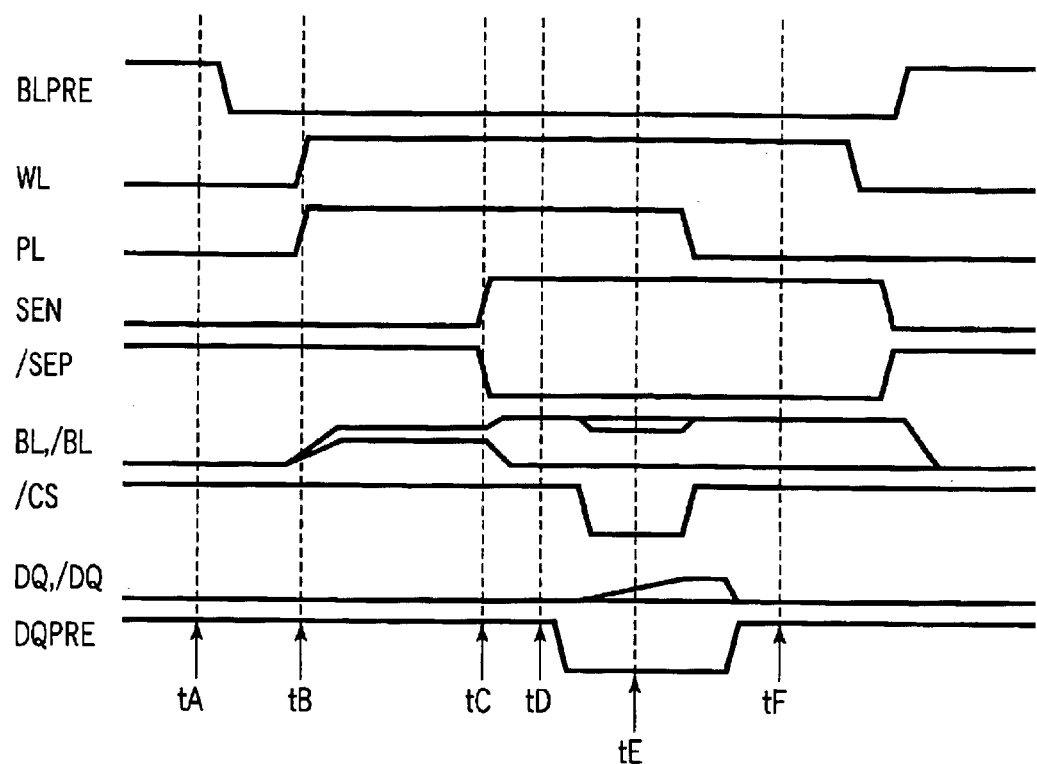
FIG. 8 is a timing chart showing the operation waveforms of the ferroelectric memory shown in FIG. 7.

FIG. 8 is a timing chart showing the operation waveforms of the circuit portion shown in FIG. 7. In this embodiment, the dummy cell DMC (dummy word line DWL and reference voltage source VREF) in the prior art (FIG. 1) or the first embodiment (FIG. 4) can be omitted. The bit lines BL and /BL are set to complementary potentials.

In this arrangement as well, when the column select gate is constituted by NMOS transistors, the "L"-level-side potential of the bit lines becomes 0 V+ΔV at the time of activation of the column select gate. The write voltage for "0" data, i.e., the voltage applied to the memory cell capacitor FC becomes lower than the ideal voltage −VAA.

Even in the second embodiment, the column select gate is constructed by PMOS transistors Q13 and Q14, as in the first embodiment. With this structure, any increase in "L"-level-side potential of the bit lines BL and /BL is prevented when the column select gate is activated while PL="H" level. Hence, data with an ideal signal amount can be restored to the ferroelectric capacitor FC.

[Third Embodiment]

Figure 9:
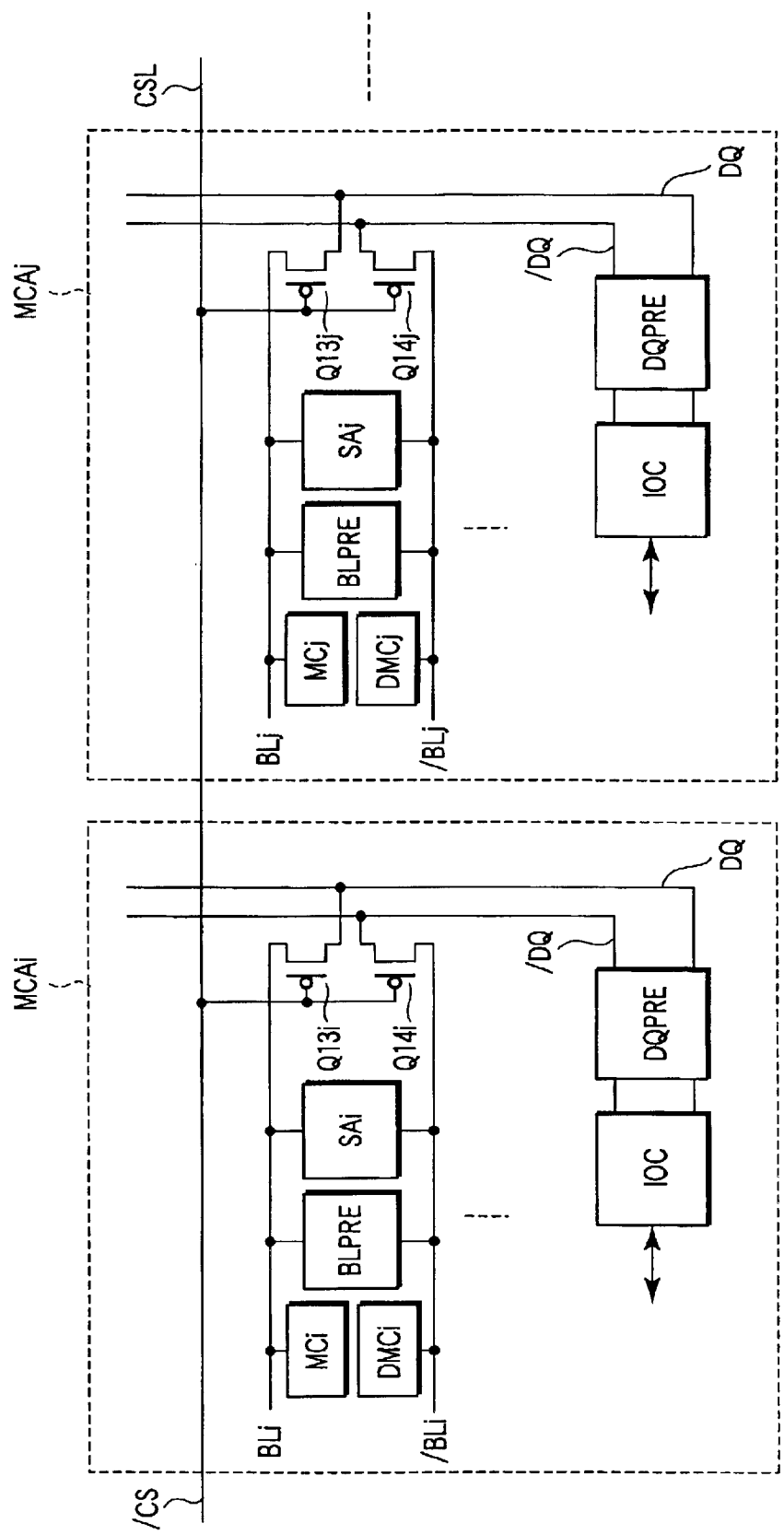
FIG. 9 is a circuit diagram showing main part of a ferroelectric memory according to the third embodiment of the present invention so as to explain the ferroelectric memory.

FIG. 9 is a circuit diagram showing main part of a ferroelectric memory according to the third embodiment of the present invention so as to explain the ferroelectric memory. In this embodiment, a column select signal /CS is shared by a plurality of memory cell arrays.

More specifically, in the ferroelectric memory according to the third embodiment, when memory cell arrays MCAi, MCAj, . . . are in an inactive state, the precharge potential of bit lines BL and /BL is 0 V, as in the first and second embodiments described above. On the other hand, the precharge potential of data lines DQ and /DQ is also 0 V. Hence, in the memory cell arrays MCAi, MCAj, . . . in the inactive state, i.e., while both the bit lines BL and /BL and the data lines DQ and /DQ are precharged to 0 V, the bit lines BL and /BL and data lines DQ and /DQ can be selectively connected by activating a column select signal /CS. In this embodiment, a column select line CSL is shared by the plurality of memory cell arrays MCAi, MCAj, . . . by using this characteristic.

Accordingly, the generation circuit of the column select signal /CS, i.e., the column decoder circuit can be shared by the plurality of memory cell arrays MCAi, MCAj, . . . For this reason, the chip area can be reduced.

FIG. 9 shows the ferroelectric memory having a 1T1C structure which stores 1-bit data using one cell transistor and one ferroelectric capacitor. However, the third embodiment can also be applied to a ferroelectric memory having a 2T2C structure, as a matter of course.

In the third embodiment, the column select line CSL is shared by the plurality of memory cell arrays. This structure can also be applied to a plurality of blocks or a plurality of sub-arrays in a memory cell array.

As described above, according to the ferroelectric memory of each of the above embodiments of the present invention, the column select gate is constructed by only P-channel MOS transistors. With this structure, data destruction in transferring data from the bit lines to the data lines can be prevented using the characteristic that the P-channel MOS transistors are not rendered conductive when the bit lines and data lines are set to potentials near 0 V ($V_{SS}$). In addition, as compared to a case wherein the column select gate is formed by combining a P-channel MOS transistor and N-channel MOS transistor, the number of elements and the number of control signal lines can be decreased. For this reason, the layout area can be reduced. Any increase in power consumption of the control circuit can also be suppressed.

Hence, any degradation in data in rewriting data read out from a memory cell can be prevented, and the data read margin can be ensured without increasing the cycle time or layout area.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A ferroelectric memory comprising:
   a memory cell which stores data in correspondence with a polarization state of a ferroelectric substance;
   a first bit line connected to the memory cell;
   a sense amplifier connected to the first bit line;
   a first data line to which data is transferred; and
   a first column select gate which is formed from a P-channel MOS transistor that has a current path connected between the first bit line and the first data line and is controlled by a column select signal,
   wherein while the first data line is set to 0 V, data is read out from the memory cell to the first bit line, amplified and held by the sense amplifier, and transferred from the first bit line to the first data line through the first column select gate by setting the column select signal to low level.

2. The memory according to claim 1, which further comprises a second bit line which is set to a reference potential when the data is read out from the memory cell, and in which the sense amplifier amplifies and holds a potential difference between the first bit line and the second bit line.

3. The memory according to claim 2, wherein the reference potential is an intermediate potential between a potential obtained when "1" data is read out to the first bit line and that obtained when "0" data is read out to the first bit line.

4. The memory according to claim 2, further comprising a second data line to which data that is complementary to that on the first data line is transferred, and a second column select gate which is formed from a P-channel MOS transistor that has a current path connected between the second bit line and the second data line and is controlled by the column select signal.

5. The memory according to claim 4, further comprising a first N-channel MOS transistor which has a current path connected between the first data line and a ground point and is ON/OFF-controlled by a data line precharge signal, and a second N-channel MOS transistor which has a current path connected between the second data line and the ground point and is ON/OFF-controlled by the data line precharge signal.

6. The memory according to claim 4, further comprising an I/O circuit which is connected to the first and second data lines.

7. The memory according to claim 2, further comprising a dummy cell which is connected to the second bit line and generates the reference potential.

8. The memory according to claim 7, which further comprises a dummy word line which is arranged in a direction perpendicular to the first bit line, and
   in which the dummy cell includes a third N-channel MOS transistor which has a current path with one end connected to the second bit line and the other end connected to a reference voltage source and a gate connected to the dummy word line.

9. The memory according to claim 2, wherein the memory cell comprises first and second ferroelectric capacitors and first and second cell transistors, and the first and second ferroelectric capacitors store complementary data.

10. The memory according to claim 9, which further comprises a word line arranged in a direction perpendicular to the first and second bit lines, and a plate line which is arranged in the direction perpendicular to the first and second bit lines, and
    in which one end of a current path of the first cell transistor is connected to the first bit line, the other end is connected to one electrode of the first ferroelectric capacitor, and a gate of the first cell transistor is connected to the word line,
    one end of a current path of the second cell transistor is connected to the second bit line, the other end is connected to one electrode of the second ferroelectric capacitor, and a gate of the second cell transistor is commonly connected to the word line, and
    the other electrode of each of the first and second ferroelectric capacitors is commonly connected to the plate line.

11. The memory according to claim 1, wherein the memory cell comprises one ferroelectric capacitor and one cell transistor.

12. The memory according to claim 11, which further comprises a word line arranged in a direction perpendicular to the first bit line, and a plate line which is arranged in the direction perpendicular to the first bit line, and
    in which one end of a current path of the cell transistor is connected to the first bit line, the other end is connected to one electrode of the ferroelectric capacitor, and a gate of the cell transistor is connected to the word line, and
    the other electrode of the ferroelectric capacitor is connected to the plate line.

13. A ferroelectric memory comprising:
    a plurality of memory cell arrays each comprising a plurality of memory cells each of which stores data in correspondence with a polarization state of a ferroelectric substance,
    each of the memory cell arrays comprising
    a plurality of first bit lines respectively connected to said plurality of memory cells,
    a plurality of sense amplifiers respectively connected to said plurality of first bit lines,
    a first data line to which data is transferred, and
    a column select circuit which is formed from a plurality of P-channel MOS transistors each of which has a current path connected between the first data line and a corresponding one of said plurality of first bit lines and is controlled by a column select signal,
    wherein while the first data line is set to 0 V, data are read out from said plurality of memory cells to said plurality of first bit lines, the column select signal is set to low level and supplied to the gate of each of the plurality of P-channel MOS transistors, and potentials that are amplified and held by said plurality of sense amplifiers are selectively transferred from said plurality of first bit lines to the first data line through the column select circuit.

14. The memory according to claim 13, wherein the column select signal is supplied to the gate of the plurality of P-channel MOS transistors in the column select circuits arranged in the different memory cell arrays.

15. The memory according to claim 13, which further comprises a second bit line which is set to a reference potential when the data is read out from the memory cell, and in which the sense amplifier amplifies and holds a potential difference between the first bit line and the second bit line.

16. The memory according to claim 15, wherein the reference potential is an intermediate potential between a potential obtained when "1" data is read out to the first bit line and that obtained when "0" data is read out to the first bit line.

17. The memory according to claim 15, further comprising a second data line to which data that is complementary to that on the first data line is transferred, and a second column select gate which is formed from a P-channel MOS transistor that has a current path connected between the second bit line and the second data line and is controlled by the column select signal.

18. The memory according to claim 17, further comprising a first N-channel MOS transistor which has a current path connected between the first data line and a ground point and is ON/OFF-controlled by a data line precharge signal, and a second N-channel MOS transistor which has a current path connected between the second data line and the ground point and is ON/OFF-controlled by the data line precharge signal.

19. The memory according to claim 17, further comprising an I/O circuit which is connected to the first and second data lines.

20. The memory according to claim 15, wherein the memory cell comprises first and second ferroelectric capacitors and first and second cell transistors, and the first and second ferroelectric capacitors store complementary data.

21. The memory according to claim 20, which further comprises a word line arranged in a direction perpendicular to the first and second bit lines, and a plate line which is arranged in the direction perpendicular to the first and second bit lines, and in which one end of a current path of the first cell transistor is connected to the first bit line, the other end is connected to one electrode of the first ferroelectric capacitor, and a gate of the first cell transistor is connected to the word line, one end of a current path of the second cell transistor is connected to the second bit line, the other end is connected to one electrode of the second ferroelectric capacitor, and a gate of the second cell transistor is commonly connected to the word line, and the other electrode of each of the first and second ferroelectric capacitors is commonly connected to the plate line.

22. The memory according to claim 13, wherein the memory cell comprises one ferroelectric capacitor and one cell transistor.

23. The memory according to claim 22, which further comprises a word line arranged in a direction perpendicular to the first bit line, and a plate line which is arranged in the direction perpendicular to the first bit line, and in which one end of a current path of the cell transistor is connected to the first bit line, the other end is connected to one electrode of the ferroelectric capacitor, and a gate of the cell transistor is connected to the word line, and the other electrode of the ferroelectric capacitor is connected to the plate line.

24. The memory according to claim 23, further comprising a dummy cell which is connected to the second bit line and generates the reference potential.

25. The memory according to claim 24, which further comprises a dummy word line which is arranged in a direction perpendicular to the first bit line, and in which the dummy cell includes a third N-channel MOS transistor which has a current path with one end connected to the second bit line and the other end connected to a reference voltage source and a gate connected to the dummy word line.

* * * * *